(12) United States Patent
Lee et al.

(10) Patent No.: US 10,120,016 B2
(45) Date of Patent: Nov. 6, 2018

(54) SEMICONDUCTOR TEST APPARATUS

(71) Applicant: Samsung Electronics Co., Ltd., Suwon-si (KR)

(72) Inventors: Dong-young Lee, Asan-si (KR); Byoung-jun Min, Asan-si (KR); Jong-cheol Lee, Cheonan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 34 days.

(21) Appl. No.: 15/285,849

(22) Filed: Oct. 5, 2016

(65) Prior Publication Data

US 2017/0102427 A1 Apr. 13, 2017

(30) Foreign Application Priority Data

Oct. 8, 2015 (KR) .................. 10-2015-0141642

(51) Int. Cl.
*G01R 31/02* (2006.01)
*G01R 31/26* (2014.01)
*G01R 31/28* (2006.01)
*G01R 1/02* (2006.01)
*G01R 1/04* (2006.01)
(Continued)

(52) U.S. Cl.
CPC ..... *G01R 31/2601* (2013.01); *G01R 31/2875* (2013.01); *G01R 31/2893* (2013.01); *G01R 31/31718* (2013.01)

(58) Field of Classification Search
CPC ........ G01R 31/02; G01R 31/26; G01R 31/28; G01R 31/31; G01R 31/2601; G01R 31/2808; G01R 31/3187; G01R 1/02; G01R 1/04; G01R 35/00; B23P 19/00
See application file for complete search history.

(56) References Cited

U.S. PATENT DOCUMENTS 5,788,084 A * 8/1998 Onishi .................. G01R 31/04
209/573
6,313,652 B1 11/2001 Maeng
(Continued)

FOREIGN PATENT DOCUMENTS

KR 10-0206644 7/1999
KR 10-0792488 1/2008
(Continued)

*Primary Examiner* — Neel Shah
(74) *Attorney, Agent, or Firm* — Muir Patent Law, PLLC

(57) ABSTRACT

A semiconductor test apparatus includes: a tray housing unit configured to house a customer tray loading untested semiconductor chips, secondary semiconductor chips, and non-defective semiconductor chips; a loader configured to locate the untested semiconductor chips supplied from the tray housing unit on a loading set plate and load the untested semiconductor chips onto a test tray; a tester configured to test semiconductor chips loaded on the test tray; an unloader configured to unload semiconductor chips loaded on the test tray, classify the tested semiconductor chips, and locate the classified semiconductor chips on an unloading set plate; and a retest controller configured to transfer the secondary defective semiconductor chips and the non-defective semiconductor chips to the tray housing unit and transfer the first defective semiconductor chips to the loading set plate.

18 Claims, 8 Drawing Sheets

(51) Int. Cl.
 *G01R 35/00* (2006.01)
 *G01R 31/317* (2006.01)

(56) References Cited

U.S. PATENT DOCUMENTS

| | | | |
|---|---|---|---|
| 7,109,740 B2 | 9/2006 | Chuan et al. | |
| 7,151,388 B2 | 12/2006 | Gopal et al. | |
| 7,378,864 B2 | 5/2008 | Chung et al. | |
| 7,479,779 B2 * | 1/2009 | Kikuchi | H04N 17/002 324/750.23 |
| 7,633,288 B2 * | 12/2009 | Chung | G01R 31/2893 324/762.01 |
| 7,800,393 B2 * | 9/2010 | Ito | G01R 31/2865 324/754.08 |
| 8,278,958 B2 | 10/2012 | Walsh | |
| 2004/0253753 A1 * | 12/2004 | Chung | G01R 31/01 438/17 |
| 2005/0012498 A1 | 1/2005 | Lee et al. | |
| 2005/0062463 A1 * | 3/2005 | Kim | G01R 31/2867 324/750.05 |
| 2006/0290369 A1 * | 12/2006 | Yamashita | G01R 31/2886 324/750.2 |
| 2007/0075719 A1 * | 4/2007 | Chung | G01R 31/2893 324/750.15 |
| 2009/0140761 A1 * | 6/2009 | Kim | G01R 31/01 324/750.03 |
| 2010/0115763 A1 * | 5/2010 | Kim | H01L 24/81 29/740 |
| 2012/0146673 A1 * | 6/2012 | Kim | G01R 31/3187 324/750.3 |
| 2013/0006564 A1 | 1/2013 | Chavet et al. | |
| 2013/0088253 A1 | 4/2013 | Nahar et al. | |

FOREIGN PATENT DOCUMENTS

| | | |
|---|---|---|
| KR | 10-0934034 | 6/2009 |
| KR | 10-2015-0019262 | 2/2015 |

* cited by examiner

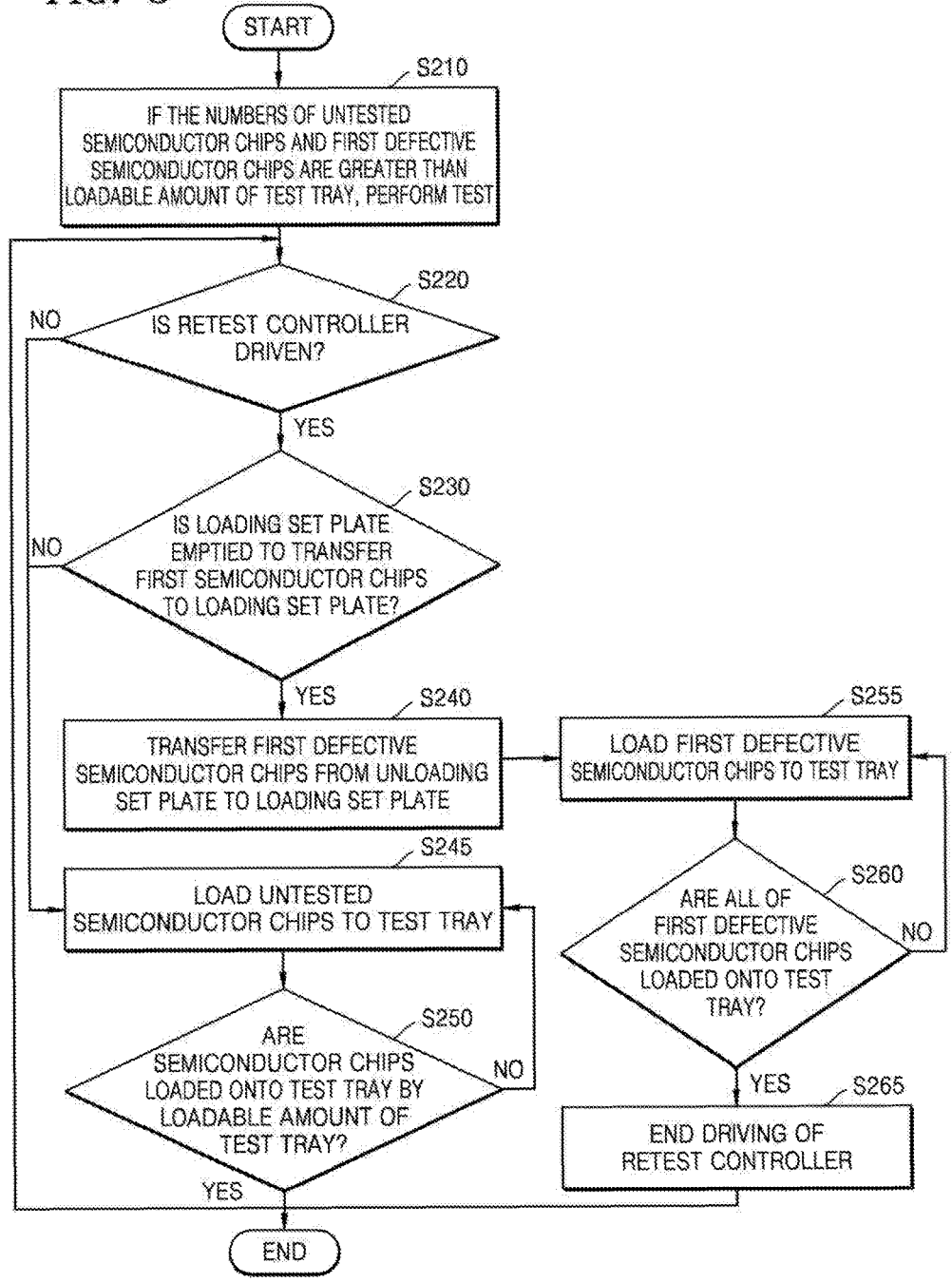

| AP | AP | AP | AP | AP | AP | AP | AP |
|----|----|----|----|----|----|----|----|
| AP | AP | AP | AP | AP | AP | AP | AP |
| AP | AP | AP | AR | AR | AR | AR | AR |
| AR | AR | AR | AR | AR | AR | AR | AR |
| AR | AR | AR | AR | AR | AR | AP | AP |
| AP | AP | AP | AP | AP | AP | AP | AP |

162

161

SEMICONDUCTOR TEST APPARATUS

CROSS-REFERENCE TO RELATED APPLICATION

This application claims the benefit of priority to Korean Patent Application No. 10-2015-0141642, filed on Oct. 8, 2015, in the Korean Intellectual Property Office, the disclosure of which is incorporated herein in its entirety by reference.

BACKGROUND

The disclosed embodiments relate to a semiconductor test apparatus, and more particularly, to a semiconductor test apparatus for classifying semiconductor chips as being defective or non-defective.

A semiconductor test process tests electrical characteristics of semiconductor chips fabricated through a semiconductor fabricating process to classify the semiconductor chips into non-defective semiconductor chips and defective semiconductor chips according to the test results. According to the result of the semiconductor test process, only the semiconductor chips finally determined as being non-defective are supplied to a user. If the semiconductor chips are classified as being defective due to their defects according to the test results, the semiconductor test apparatus finally determines the semiconductor chips as being defective.

SUMMARY

The disclosed concepts provide a semiconductor test apparatus for testing semiconductor chips to classify the semiconductor chips into non-defective semiconductor chips and defective semiconductor chips.

According to certain embodiments, the disclosure is directed to a semiconductor test apparatus comprising: a tray housing unit configured to house a customer tray on which are loaded one or more of untested semiconductor chips, secondary defective semiconductor chips, and non-defective semiconductor chips; a loader configured to locate the untested semiconductor chips supplied from the tray housing unit on a loading set plate, and load the untested semiconductor chips onto a test tray; a tester configured to test the untested semiconductor chips loaded on the test tray, wherein the test tray is loadable into and removable from the tester; an unloader configured to remove the test tray from the tester, unload the tested semiconductor chips loaded on the test tray, and classify the tested semiconductor chips as first defective semiconductor chips, the secondary defective semiconductor chips, and the non-defective semiconductor chips, wherein the unloader is further configured to transfer the first defective semiconductor chips, the secondary defective semiconductor chips, and the non-defective semiconductor chips to an unloading set plate; and a retest controller configured to transfer the secondary defective semiconductor chips and the non-defective semiconductor chips to the tray housing unit, and transfer the first defective semiconductor chips from the unloading set plate to the loading set plate, wherein the first defective semiconductor chips are retested by the tester.

According to certain embodiments, the disclosure is directed to a semiconductor test apparatus comprising: a tray housing unit configured to house a first tray housing unit configured to house untested semiconductor chips, a second tray housing unit configured to house secondary defective semiconductor chips, and a third tray housing unit configured to house non-defective semiconductor chips; a loader configured to locate the untested semiconductor chips supplied from the first tray housing unit on a loading set plate and load the untested semiconductor chips onto a test tray; a tester configured to put the test tray into and to take the test tray from and test semiconductor chips loaded on the test tray; an unloader configured to unload semiconductor chips loaded on the test tray taken from the tester and classify tested semiconductor chips as first defective semiconductor chips, the secondary defective semiconductor chips, and the non-defective semiconductor chips to locate the first defective semiconductor chips, the secondary defective semiconductor chips, and the non-defective semiconductor chips on the unloading set plate; and a retest controller configured to respectively transfer the secondary defective semiconductor chips and the non-defective semiconductor chips to the second tray housing unit and the third tray housing unit and transfer the first defective semiconductor chips to the loading set plate, wherein the loader loads the first defective semiconductor chips onto the test tray, and the tester retests the first defective semiconductor chips.

According to certain embodiments, the disclosure is directed to a semiconductor test method comprising: providing, to a loading unit, untested semiconductor chips; loading, by the loading unit, the untested semiconductor chips onto a test tray; providing, to the loading unit, first tested semiconductor chips from an unloading unit; loading, by the loading unit, the first tested semiconductor chips onto the test tray; placing the test tray containing untested and first tested semiconductor chips into a test unit; after testing, removing the test tray containing tested semiconductor chips from the test unit; and classifying, by a classifier in the unloading unit, the tested semiconductor chips as first defective semiconductor chips, secondary defective semiconductor chips, and non-defective semiconductor chips.

BRIEF DESCRIPTION OF THE DRAWINGS

Exemplary embodiments will be more clearly understood from the following detailed description taken in conjunction with the accompanying drawings in which:

FIG. 3 is a flowchart of a semiconductor test method using a semiconductor test apparatus, according to certain exemplary embodiments;

FIG. 4A schematically illustrates a customer tray placed above a loading set plate;

FIG. 4B schematically illustrates a test tray placed above the loading set plate;

DETAILED DESCRIPTION OF THE EMBODIMENTS

Figure 1:
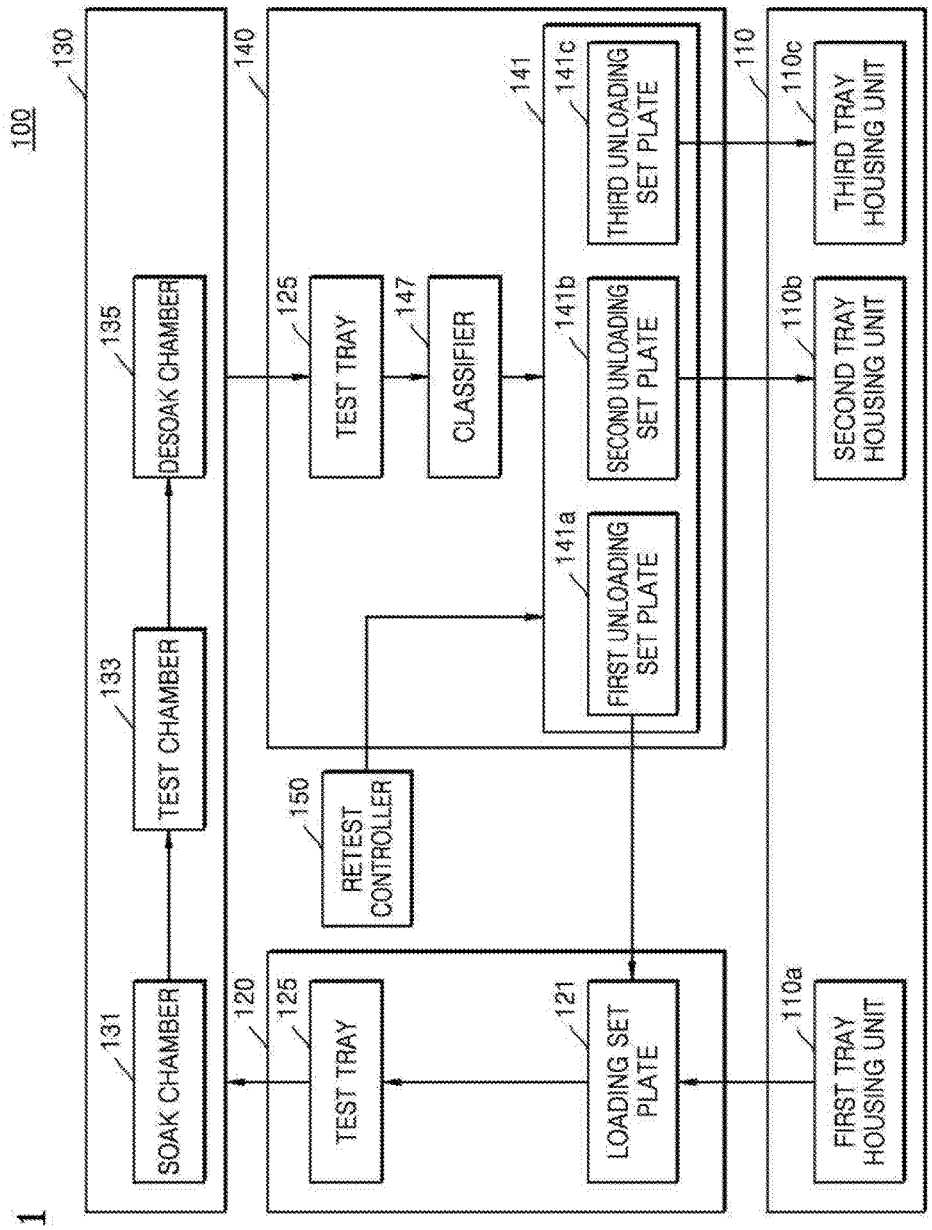
FIG. 1 is a block diagram of a semiconductor test apparatus according to certain exemplary embodiments.

The disclosed concepts will now be described more fully with reference to the accompanying drawings, in which exemplary embodiments are shown. The disclosed embodiments may, however, be embodied in many different forms and should not be construed as being limited to the embodiments set forth herein. In the drawings, the thicknesses of layers and regions are exaggerated for clarity.

It will be understood that when an element is referred to as being "on," "connected to" or "coupled to" another element, it may be directly on, connected or coupled to the other element or intervening elements may be present. In contrast, when an element is referred to as being "directly on," "directly connected to" or "directly coupled to" another element, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "above" may encompass both an orientation of above and below. The device may be otherwise oriented (rotated 90 degrees or at other orientations) and the spatially relative descriptors used herein interpreted accordingly. Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

The terminology used herein is for the purpose of describing particular embodiments only and is not intended to be limiting of example embodiments. As used herein, the singular forms are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A semiconductor test apparatus that will be described hereinafter may have various types of structures.

Expressions such as "at least one of" when preceding a list of elements, modify the entire list of elements and do not modify the individual elements of the list.

FIG. 1 is a block diagram of a semiconductor test apparatus 100 according to an exemplary embodiment.

Referring to FIG. 1, the semiconductor test apparatus 100 may include a tray housing unit 110, a loading unit 120, a test unit 130, an unloading unit 140, and a retest controller 150.

The tray housing unit 110 may include a first tray housing unit 110a, a second tray housing unit 110b, and a third tray housing unit 110c. Semiconductor chips may be loaded onto customer trays, and each customer tray may be housed in one of the first housing tray 110a, the second housing tray 110b, and the third housing tray 110c. For example, the first tray housing unit 110a may house a customer tray on which untested semiconductor chips are loaded. The second tray housing unit 110b may house a customer tray on which semiconductor chips classified as being secondary defective are loaded. The third tray housing unit 110c may house a customer tray on which semiconductor chips classified as being non-defective are loaded. Semiconductor chips classified as non-defective may be those that, after being tested a first time (e.g., tested one prior time) and/or second time (e.g., tested two prior times), are found to be non-defective. For example, semiconductor chips that are found to be defective after a first test but found to be non-defective after a second test may be classified as non-defective following the second test. Semiconductor chips classified as first defective may be those that, after being tested a first time, are found to be defective and, in some embodiments, may be retested. Semiconductor chips classified as secondary defective may be those that, after being tested a second time, are found to be defective. Semiconductor chips classified as being untested may be those that have not been previously tested (i.e., tested no prior times).

The tray housing unit 110 may house a first lot of semiconductor chips, and may provide the loading unit 120 with the first lot of semiconductor chips. The first lot of semiconductor chips may be tested, and the first lot of semiconductor chips classified according to test results (e.g., first defective, secondary defective, non-defective). After testing the first lot of semiconductor chips, a second lot of semiconductor chips may be provided to the tray housing unit 110.

The loading unit 120 may be supplied with a customer tray loaded with untested semiconductor chips from the tray housing unit 110, and may load the untested semiconductor chips onto a test tray 125 waiting in the loading unit 120. Also, the loading unit 120 may be supplied with semiconductor chips, which are classified as being first defective according to a test result, from the unloading unit 140 and load the semiconductor chips classified as being first defective onto the test tray 125 waiting in the loading unit 120.

A loading set plate 121 may provide a space where a customer tray loaded with semiconductor chips to be tested may be placed. For example, a customer tray on which untested semiconductor chips are loaded may be transferred from the first tray housing unit 110 and placed on a loading set plate 121. Also, the customer tray on which the semiconductor chips classified as being first defective are loaded may be transferred from a first unloading set plate 141a and placed on the loading set plate 121. The untested semiconductor chips and the semiconductor chips classified as being first defective wait on the loading set plate 121 before being loaded onto the test tray 125. In some embodiments, both untested semiconductor chips and semiconductor chips classified as being first defective can be place on and wait on the loading set plate 121 so that they are both on the loading set plate 121 at the same time, before being loaded onto the test tray 125.

Semiconductor chips located on the loading set plate 121 may be transferred to the test tray 125 by a loading robot (not shown) of the loading unit 120. Here, the loading robot may include an adsorbing unit on a side thereof facing the semiconductor chips. The loading robot may adsorb semiconductor chips located on the loading set plate 121 to transfer the semiconductor chips from the loading set plate 121 to the test tray 125.

The test tray 125 may include a plurality of housing units that may house semiconductor chips. Semiconductor chips loaded on the test tray 125 may be filled sequentially from an upper part of the test tray 125 to a lower part of the test tray 125. For example, the test tray 125 may include housing units that are arranged in n rows and m columns, and n×m semiconductor chips may be loaded on one test tray 125. Two test trays 125 may be used for a test. Here, a loadable amount of the test trays 125 corresponds to a value that is acquired by multiplying a loadable amount of chips on one test tray 125 and the number of test trays 125 used for the test. For example, when two test trays 125 are used to perform a one-time cycle test, a loadable amount of chips on the test trays 125 is 2×n×m.

The test tray 125 may sequentially circulate through the loading unit 120, the test unit 130, and the unloading unit 140. For example, the loading unit 120 puts the test tray 125, on which semiconductor chips to be tested are loaded, into the test unit 130. The test unit 130 may test semiconductor chips loaded on the test tray 125 and move the test tray 125 to the unloading unit 140. The unloading unit 140 may unload the tested semiconductor chips from the test tray 125 and move the test tray 125 to the loading unit 120. The test tray 125 moved to the loading unit 120 waits in the loading unit 120 for loading of semiconductor chips to be tested next. For example, after the tested semiconductor chips are unloaded from test tray 125, the test tray 125 may wait in the loading unit 120 to be loaded with semiconductor chips that are to be tested.

The test unit 130 may test semiconductor chips loaded on the test tray 125 and take the test tray 125 to the unloading unit 140. The test unit 130 may include a soak chamber 131, a test chamber 133, and a desoak chamber 135.

Semiconductor chips to be tested may be transferred into the soak chamber 131 before being transferred into the test chamber 133. The soak chamber may be used to bring the temperature of the semiconductor chips to a test temperature. For example, the soak chamber 131 may heat or cool semiconductor chips to a test temperature, which is demanded in the test chamber 133, from a room temperature. In some embodiments, the soak chamber 131 may apply heat or cold to bring the temperature of the semiconductor chips to a test temperature used in the test chamber. Here, when temperatures of semiconductor chips are changed to the test temperature in the soak chamber 131 before the semiconductor chips are tested, a time taken for testing semiconductor chips may be reduced more than when temperatures of semiconductor chips are changed to the test temperature in the test chamber 133.

Semiconductor chips in the soak chamber 131 may be loaded onto the test tray 125 to be transferred into the test chamber 133. The test chamber 133 may test electrical characteristics of semiconductor chips and determine whether the semiconductor chips under test are defective. Semiconductor chips tested in the test chamber 133 may be loaded onto the test tray 125 to be transferred into the desoak chamber 135. The desoak chamber 135 may be used to bring the temperature of the semiconductor chips from a test temperature to a room temperature. For example, the desoak chamber 135 may return temperatures of semiconductor chips, which are set to test temperatures to perform a test, to a room temperature to remove thermal stresses from the semiconductor chips.

However, differently from this, semiconductor chips may demand a different type of heating or cooling process before being tested. Therefore, in some exemplary embodiments, differently from being shown in FIG. 1, the test unit 130 may not include the soak chamber 131 and the desoak chamber 135.

The unloading unit 140 may unload semiconductor chips loaded on the test tray 125 and taken from the test unit 130. The unloading unit 140 may include a classifier 147 which classifies tested semiconductor chips according to test results and an unloading set plate 141 on which a customer tray loading the semiconductor chips classified by the classifier 147 may be placed.

The classifier 147 may classify tested semiconductor chips, which are loaded on the test tray 125 and taken from the test unit 130, as into first defective semiconductor chips determined to be defective a first time, secondary defective semiconductor chips determined to be defective two or more times, and non-defective semiconductor chips determined after testing not to be defective, according to test results. The unloading unit 140 may transfer semiconductor chips as described above to the unloading set plate 141 by using the unloading robot (not shown) including the adsorbing unit.

The unloading set plate 141 may provide a space where a customer tray loaded with tested semiconductor chips may be placed, and may include a first unloading set plate 141a, a second unloading set plate 141b, and a third unloading set plate 141c. The tested semiconductor test chips may be loaded onto customer trays of the first, second, and third unloading set plates 141a, 141b, and 141c based on the classifications performed by the classifier 147. For example, first defective semiconductor chips may be loaded onto a customer tray provided above the first unloading set plate 141a. Secondary defective semiconductor chips may be loaded onto a customer tray provided above the second unloading set plate 141b. Non-defective semiconductor chips may be loaded onto a customer tray provided above the third unloading set plate 141c.

The retest controller 150 may initiate retest of the first defective semiconductor chips, and may cause the secondary defective semiconductor chips and the non-defective semiconductor chips to be transferred to the tray housing unit 110. The non-defective semiconductor chips may be loaded onto a customer tray to be transferred to a place where a process is performed after testing. The secondary defective semiconductor chips may be finally determined as being defective to be discarded, or the secondary defective semiconductor chips may be retested a third or subsequent time to be determined as being defective or non-defective.

The retest controller 150 enables the first defective semiconductor chips to be immediately transferred from the unloading set plate 141 (e.g., the first unloading set plate 141a) to the loading set plate 121. Operational demands may be reduced more than when the first defective semiconductor chips are transferred to the loading set plate 121 after being transferred to and housed in the tray housing unit 110. For example, the number of operations may be reduced when the first semiconductor chips are transferred from the unloading set plate 141 to the loading set plate 121, rather than being transferred from the unloading set place 141 to the tray housing unit 110 for subsequent transfer to the loading set plate 121. Therefore, a process time taken for testing may be reduced. The retest controller 150 may determine whether to transfer the first defective semiconductor chips from the unloading set plate 141 to the loading set plate 121, and further may enable the first defective semiconductor chips to be transferred at an appropriate time.

In some embodiments, to be described later with reference to FIGS. 7 and 8, the retest controller 150 may transfer the first defective semiconductor chips to the tray housing unit 110 under certain predetermined conditions.

Figure 2:
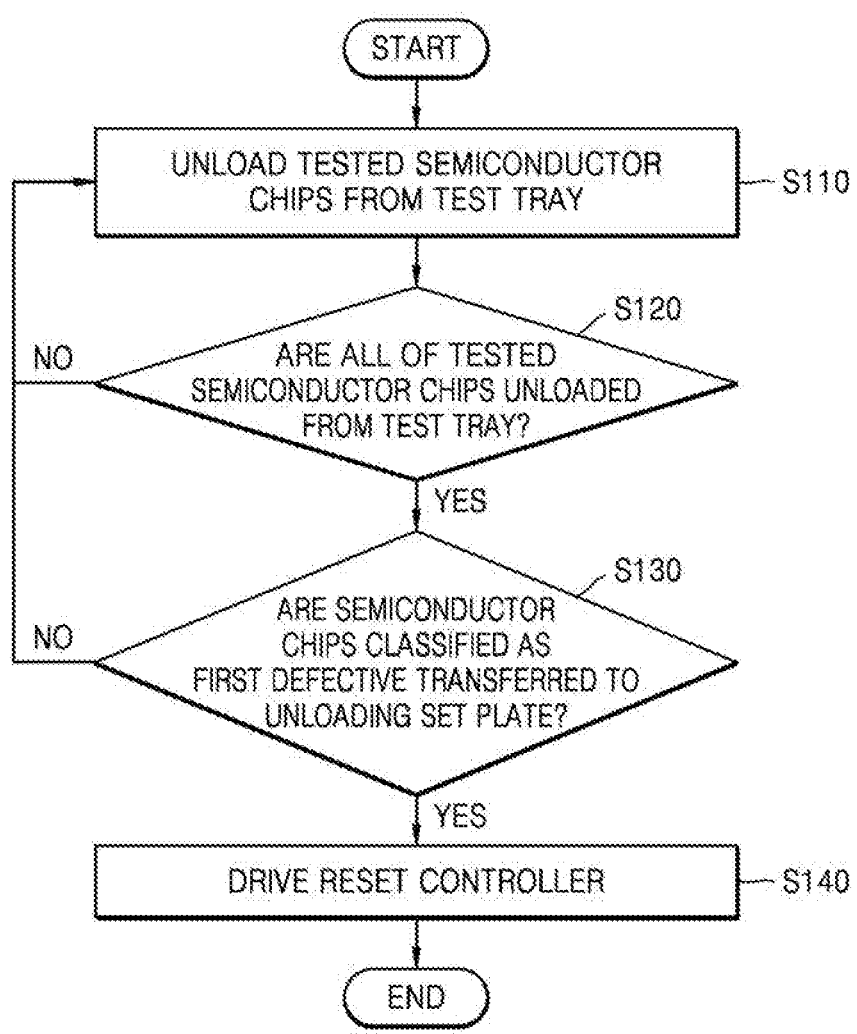
FIG. 2 is a flowchart of a method of driving a retest controller according to certain exemplary embodiments.

FIG. 2 is a flowchart of a method of driving a retest controller according to an exemplary embodiment.

Referring to FIGS. 1 and 2, semiconductor chips, which have been loaded on the test tray 125 and tested in the test unit 130, are unloaded from the test tray 125 in operation S110. The tested semiconductor chips are unloaded from the test tray 125 in the unloading unit 140, and classified into first defective semiconductor chips, secondary defective semiconductor chips, and non-defective semiconductor chips by the classifier 147 based on the results of testing in the test unit 130.

In operation S120, the retest controller 150 determines whether the tested semiconductor chips are unloaded from the test tray 125. If it is determined that not all of the semiconductor chips have been unloaded from the test tray 125 (S120, No), the unloading process will continue and the retest controller 150 may continue to periodically check to determine if the unloading has been completed. If it is determined that semiconductor chips loaded on the test tray 125 are all unloaded (S120, Yes), the test tray 125 is transferred from the unloading unit 140 to the loading unit 120, and waits in the loading unit 120 to load semiconductor chips that are to be tested next. In the unloading unit 140, classified semiconductor chips may be transferred to the first through third unloading set plates 141a through 141c. In operation S130, the retest controller 150 determines whether first defective semiconductor chips have been transferred to the first unloading set plate 141a. If it is determined in operation S130 that the first defective semiconductor chips have been transferred to the first unloading set plate 141a (S130, Yes), the retest controller 150 starts to be driven in operation S140. For example, in operation S140, the retest controller 150 may initiate or begin to operate. As the retest controller 150 is driven or operates, the first defective semiconductor chips are transferred from the first unloading set plate 141a to the loading set plate 121 at an appropriate time.

If semiconductor chips are not completely unloaded from the test tray 125 and one or more semiconductor chips remain in the test tray 125 (S120, No), the retest controller 150 finishes an unloading job of the test tray 125 and then determines whether the first defective semiconductor chips appear. If the first defective semiconductor chips are not transferred to the unloading set plate 141 (S130, No), it may be determined that there are no first defective semiconductor chips at that current time, and thus the retest controller 150 does not start to be driven. For example, the retest controller 150 may not begin until it determines there are first defective semiconductor chips.

FIG. 3 is a flowchart of a semiconductor test method using a semiconductor test apparatus, according to an exemplary embodiment. FIG. 4A schematically illustrates a customer tray placed above a loading set plate. FIG. 4B schematically illustrates a test tray placed above the loading set plate. FIGS. 3 through 4B illustrate a semiconductor test performed if the numbers of untested semiconductor chips and first defective semiconductor chips are larger than a loadable amount of a test tray.

Referring to FIGS. 1 and 3, if the numbers of untested semiconductor chips and first defective semiconductor chips are greater than a loadable amount of the test tray 125, a semiconductor test is performed in operation S210. The numbers of untested semiconductor chips and first defective semiconductor chips are equal to the number that is acquired by subtracting the number of secondary defective semiconductor chips and the number of non-defective semiconductor chips from the total number of semiconductor chips. For example, the number of semiconductor chips to be tested is the sum of the total number of semiconductor chips minus the number of tested semiconductor chips determined to be either non-defective or secondary defective.

In operation S220, a determination is made as to whether the retest controller 150 should be driven. As described with reference to FIG. 2, if the first defective semiconductor chips are transferred to the first unloading set plate 141 (S130, Yes), the retest controller 150 is driven in operation S140. If the first defective semiconductor chips are not transferred to the first unloading set plate 141a (S130, No), the retest controller 150 is not driven. If the retest controller 150 is not driven (S220, No), in operation S245, the loading unit 120 loads the untested semiconductor chips onto the test tray 125. Therefore, the test tray 125 is filled with the untested semiconductor chips, and the test unit 130 tests the untested semiconductor chips.

If it is determined in operation S220 that the retest controller 150 is driven (S220, Yes), the retest controller 150 determines whether the loading set plate 121 is emptied so as to transfer the first defective semiconductor chips to the loading set plate 121 in operation S230. If the retest controller 150 senses that the loading set plate 121 is not emptied (S230, No), the loading unit 120 loads the untested semiconductor chips onto the test tray 125 in operation S245. If the retest controller 150 senses that the loading set plate 121 is emptied (S230, Yes), the retest controller 150 transfers a customer tray, on which the first defective semiconductor chips are loaded, from the first unloading set plate 141a to the loading set plate 121 in operation S240. In operation S255, the first defective semiconductor chips are loaded onto the test tray 125 waiting in the loading unit 120. In operation S260, a determination is made as to whether the first defective semiconductor chips located on the loading set plate 121 are loaded onto the test tray 125. If all the first defective semiconductor chips are transferred (S260, Yes), driving of the retest controller 150 ends in operation S265. If all of the first defective semiconductor chips are not transferred (S260, No), the transfer of the first defective semiconductor chips continues (S255) until all of the first defective semiconductor chips are transferred to the test tray 125 at which time the driving of the retest controller 150 ends in operation S265. For example, the retest controller 150 may stop operating when all of the first defective semiconductor chips are transferred to the test tray 125.

If the loading set plate 121 is not empty (S230, No), the first defective semiconductor chips are not transferred to the loading set plate 121, and untested semiconductor chips are loaded onto the test tray 125 in operation S245. The untested semiconductor chips are transferred to the test tray 125 to provide a space where a customer tray loaded with the first defective semiconductor chips may be placed in the loading set plate 121. The customer tray loading the first defective semiconductor chips is transferred to the loading set plate 121.

In operation S250, a determination is made as to whether semiconductor chips are filled in the test tray 125 to a loadable amount of the test tray 125. If the test tray 125 is not completely filled, untested semiconductor chips are further loaded to fill the test tray 125 with the untested semiconductor chips, and then a test is performed.

Referring to FIGS. 1, 4A, and 4B, two customer trays 123 may be placed above the loading set plate 121. First defective semiconductor chips 162 may be loaded onto a first customer tray 123a, and untested semiconductor chips 161 may be loaded onto a second customer tray 123b. Here, the first customer tray 123a may be a customer tray that is transferred from the first unloading set plate 141a, and the second customer tray 123b may be a customer tray that is transferred from the first tray housing unit 110a.

The loading unit 120 may load the first defective semiconductor chips 162 from the first customer tray 123a onto the test tray 125. If the test tray 125 is not all filled after the first defective semiconductor chips 162 are loaded onto the test tray 125, the loading unit 120 may load the untested semiconductor chips 161 loaded on the second customer tray 123b onto the test tray 125. In FIG. 4B, the first defective semiconductor chips 162 are labeled as "AR" and the untested semiconductor chips are labeled as "AP."

If the retest controller 150 is driven, i.e., if the first defective semiconductor chips are transferred to the first unloading set plate 141, the loading unit 120 may map a filled part and an unfilled part of the test tray 125 and load the first defective semiconductor chips 162 or the untested semiconductor chips 161 in the unfilled part. In some embodiments, the first defective semiconductor chips 162 and the untested semiconductor chips 161 may be sequentially loaded in the unfilled part of the test tray 125 from an upper part. For example, a first defective semiconductor chip 162 may be loaded in the unfilled part of the test tray 125, then one or more untested semiconductor chips 161 may be loaded in the unfilled part of the test tray 125, then another first defective semiconductor chip 162 may be loaded in the unfilled part of the test tray 125, then one or more another untested semiconductor chips 161 may be loaded in the unfilled part of the test tray 125, and so on. Therefore, at least one first defective semiconductor chips 162 and at least one untested semiconductor chips 161 may be loaded onto the test tray 125 waiting in the loading unit 120 so that they are on the test tray 125 at the same time. In other embodiments, multiples of the first defective semiconductor chips 162 and multiples of the untested semiconductor chips 161 may be sequentially loaded in the unfilled part of the test tray 125 from an upper part. For example, all of the first defective semiconductor chips 162 may be loaded first into the unfilled part of the test tray 125 from the customer tray 123a, then the untested semiconductor chips 161 may be loaded in the remaining unfilled part of the test tray 125 from the customer tray 123b until the test tray 125 is full (or vice versa). In either embodiment, the untested semiconductor chips 161 and the first defective semiconductor chips 162 to be retested may be simultaneously tested. For example, both untested semiconductor chips 161 and first defective semiconductor chips 162 may be placed in the test unit 130 and more specifically in the test chamber 133 at the same time for testing (e.g., they may be place on a same tray in the test chamber 133).

Figure 5:
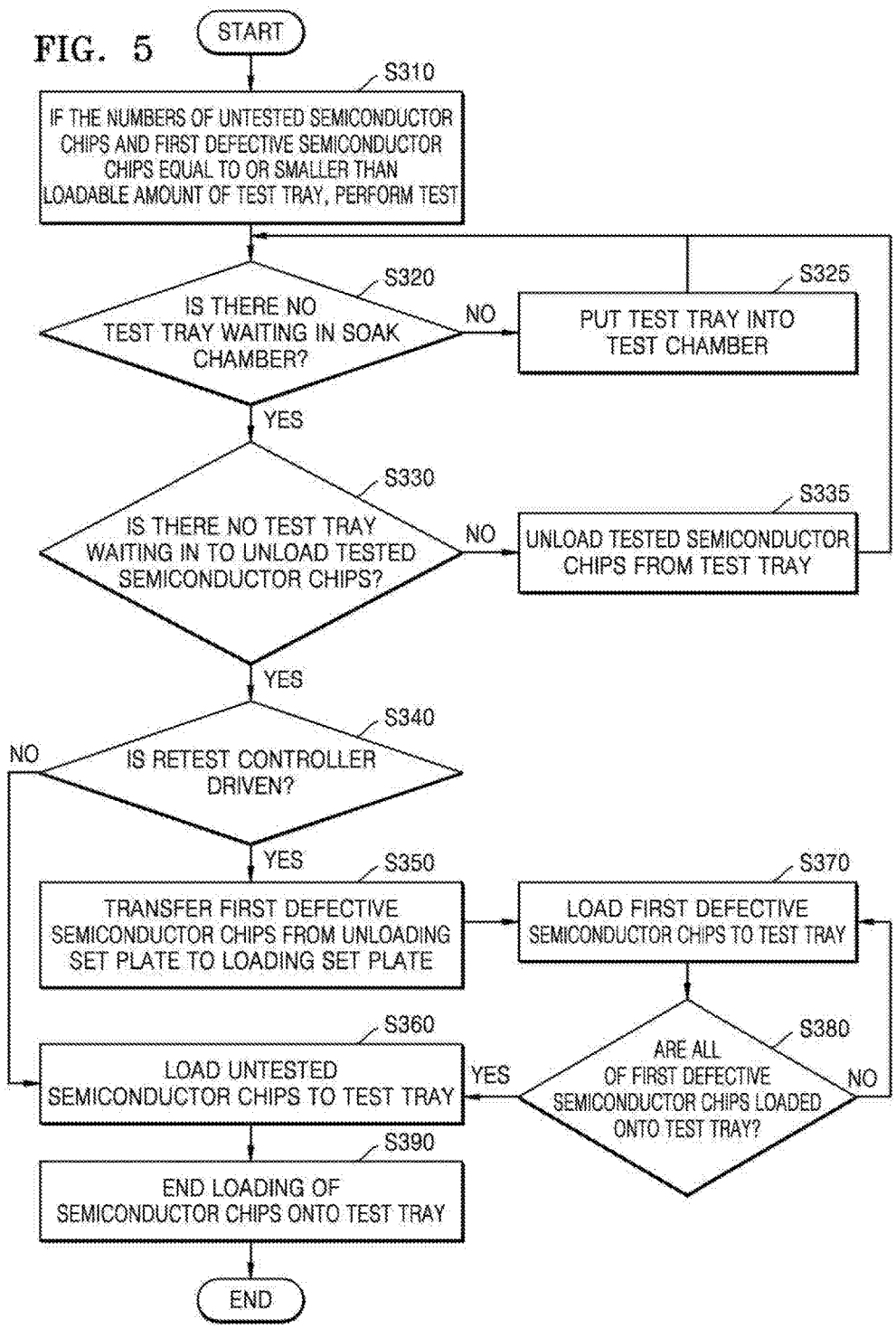
FIG. 5 is a flowchart of a semiconductor test method using a semiconductor test apparatus, according to certain exemplary embodiments.
Figures 6A, 6B:
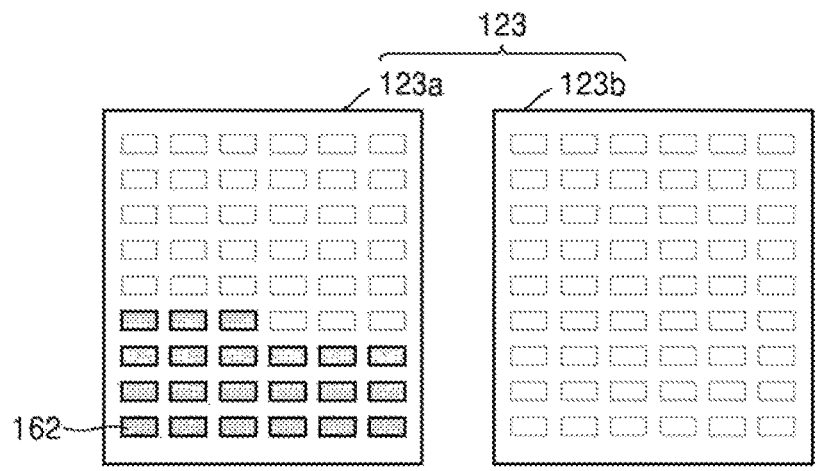
FIG. 6A schematically illustrates a customer tray placed above a loading set plate.
FIG. 6B schematically illustrates a test tray placed above the loading set plate.

FIG. 5 is a flowchart of a semiconductor test method using a semiconductor test apparatus, according to an exemplary embodiment. FIG. 6A schematically illustrates a customer tray placed above a loading set plate. FIG. 6B schematically illustrates a test tray placed above the loading set plate. FIGS. 5 through 6B illustrate a semiconductor test performed if the numbers of untested semiconductor chips and first defective semiconductor chips are equal to or smaller than a loadable amount of a test tray.

Referring to FIGS. 1 and 5, in operation S310, a semiconductor test is performed if the numbers of untested semiconductor chips and first defective semiconductor chips are equal to or smaller than a loadable amount of the test tray 125. Here, the untested semiconductor chips and the first defective semiconductor chips may be all loaded onto the test tray 125, and a one-time cycle test may be performed to test all semiconductor chips one or more times.

If there are semiconductor chips being tested in the test unit 130, before ending a job of loading semiconductor chips onto the test tray 125, the loading unit 120 lets the test tray 125 wait in the loading unit 120 until the semiconductor chips that are being tested are all classified by the classifier 147. For example, if semiconductor chips that remain after one-time cycle test are all tested, the loading unit 120 lets the test tray 125 wait in the loading unit 120 until first defective semiconductor chips are loaded onto the loading set plate 121.

In detail, in operation S320, a determination is made as to whether there is no test tray 125 waiting in the soak chamber 131 to move to the test chamber 133. If it is determined in operation S320 that there is no test tray 125 waiting in the soak chamber 131 (S320, Yes), a determination is made as to whether there is no test tray 125 in the unloading unit 140 waiting to unload tested semiconductor chips in operation S330. If it is determined that there is no test tray 125 waiting to unload the tested semiconductor chips (S330, No), the loading unit 120 may load remaining untested semiconductor chips onto the test tray 125 or may transfer the first defective semiconductor chips located on the unloading set plate 141 to the loading set plate 121.

If the test tray 125 waiting in the soak chamber 131 exists (S320, No), the test tray 125 is put into the test chamber 133 to perform a test in operation S325. Also, if there is the test tray 125 in the unloading unit 140 on which semiconductor chips to be unloaded are loaded (S330, No), semiconductor chips remaining in the test tray 125 are unloaded from the test tray 125 in operation S335. Semiconductor chips unloaded from the test tray 125 are classified by the classifier 147 and transferred to the unloading set plate 141, and the test tray 125 is transferred from the unloading unit 140 to the loading unit 120 to wait so as to load semiconductor chips that are to be tested.

If there is the test tray 125 that is performing a test in the test unit 130 or the test tray 125 waits in the unloading unit 140 to unload tested semiconductor chips, a determination is made as to whether the retest controller 150 is driven in operation S340. As described with reference to FIG. 2, if first defective semiconductor chips are transferred to the first unloading set plate 141a, the retest controller 150 is driven. If the retest controller 150 is not driven, first defective semiconductor chips do not exist, and thus a retest is not performed.

If it is determined in operation S340 that the retest controller 150 is driven (S340, Yes), the retest controller 150 transfers a customer tray loading first defective semiconductor chips from the unloading set plate 141 to the loading set plate 121 to retest the first defective semiconductor chips in operation S350. In operation S370, the first defective semiconductor chips are loaded onto the test tray 125 waiting in the loading unit 120. In operation S380, a determination is made as to whether the first defective semiconductor chips located on the loading set plate 121 are all transferred to the test tray 125. If it is determined in operation S380 that the first defective semiconductor chips are all transferred to the test tray 125 (S380, Yes), remaining untested semiconductor chips are transferred to the test tray 125 in operation S360. When the test tray 125 is fully loaded with the remaining semiconductor chips, the test tray 125 waiting in the loading unit 120 is put into the test unit 130 to perform a last cycle test in operation S390.

If the retest controller 150 is not driven (S340, No), the first defective semiconductor chips do not exist, and untested semiconductor chips are loaded onto the test tray 125 in operation S360. The loading unit 120 puts the test tray 125 into the test unit 130 to perform the last cycle test.

Referring to FIGS. 1, 6A, and 6B, two customer trays 123 may be placed above the loading set plate 121. First defective semiconductor chips 162 may be loaded on a first customer tray 123a, and untested semiconductor chips (e.g., untested semiconductor chips 161 of FIG. 4A) may be loaded on a second customer tray 123b. However, as shown in FIG. 6, there are no untested semiconductor chips remaining in the loading set plate 121, and the second customer tray 123b is empty. The first customer tray 123a may be a customer tray that is transferred from the first unloading set plate 141a. In FIG. 6B, the first defective semiconductor chips 162 are labeled as "AR" and the untested semiconductor chips are labeled as "AP."

The first defective semiconductor chips loaded onto the first customer tray 123a may be transferred to the test tray 125 and may be sequentially loaded in a remaining space of the test tray 125 from an upper part. As shown in the example of FIG. 6B, the number of semiconductor chips to be tested is equal to or smaller than a loadable amount of the test tray 125. Therefore, differently from the example shown in FIG. 4B, although the test tray 125 is not all filled, the loading unit 120 may put the test tray 125 into the test unit 130 to perform a test.

Figure 7:
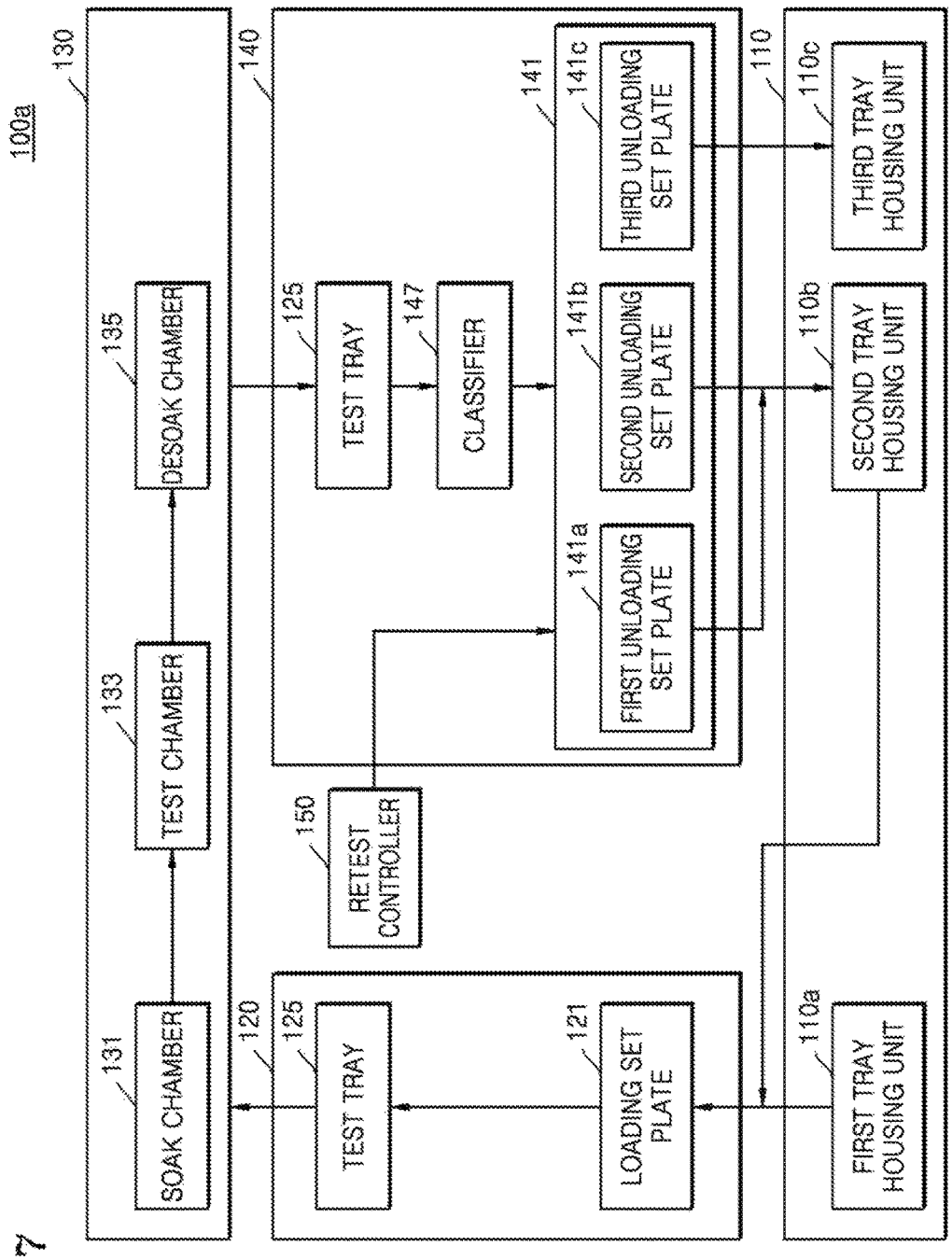
FIG. 7 is a block diagram of a semiconductor test apparatus according to certain exemplary embodiments.

FIG. 7 is a block diagram of a semiconductor test apparatus 100a according to an exemplary embodiment. FIG. 7 illustrates a configuration of the semiconductor test apparatus 100a that processes semiconductor chips classified according to a last cycle result after operation S390 of FIG. 5. For example, FIG. 7 illustrates the process after putting the test tray 125, on which all of remaining semiconductor chips are loaded, into the test unit 130 to perform a last cycle. The same elements of FIG. 7 as those of FIG. 1 are denoted by the same reference numerals, and descriptions of the same elements are omitted or simplified.

A tray housing unit 110 may include a first tray housing unit 110a, a second tray housing unit 110b, and a third tray housing unit 110c. Differently from being shown in FIG. 1, the second tray housing unit 110b may house first defective semiconductor chips and secondary defective semiconductor chips.

A test tray 125 is put into a test unit 130 to perform a test, and an unloading unit 140 unloads tested semiconductor chips from the test tray 125. In some embodiments, the tested semiconductor chips may be classified into first defective semiconductor chips, secondary defective semiconductor chips, and non-defective semiconductor chips. Classified semiconductor chips may be transferred to an unloading set plate 141. In other words, the first defective semiconductor chips, the second defective semiconductor chips, and the non-defective semiconductor chips may be respectively transferred to a first unloading set plate 141a, a second unloading set plate 141b, and a third unloading set plate 141c.

Differently from FIG. 1, a retest controller 150 may transfer the first defective semiconductor chips to the second tray housing unit 110b to house the first defective semiconductor chips along with the second tray housing unit 110b. In other words, semiconductor chips that are first defective in a last cycle test may be treated as being semiconductor chips that are classified as being defective two or more times, to be housed in the second tray housing unit 110b. Therefore, the second tray housing unit 110b may house semiconductor chips that are classified into secondary defective semiconductor chips for several times tests and semiconductor chips that are classified as being first defective on a last cycle.

Semiconductor chips housed in the second tray housing unit 110b may be transferred to the loading set plate 121 to be retested. For example, semiconductor chips that are classified as being first defective on a last cycle may be retested along with secondary defective semiconductor chips. In some embodiments, the semiconductor chips that are classified as being first defective on the last cycle may be separately retested, and may not to go through a process of classifying the first defective semiconductor chips into non-defective semiconductor chips and secondary defective semiconductor chips. Also, the semiconductor chips that are classified as being first defective on the last cycle may be retested along with accumulated secondary semiconductor chips to reduce the total number of cycles.

Figure 8:
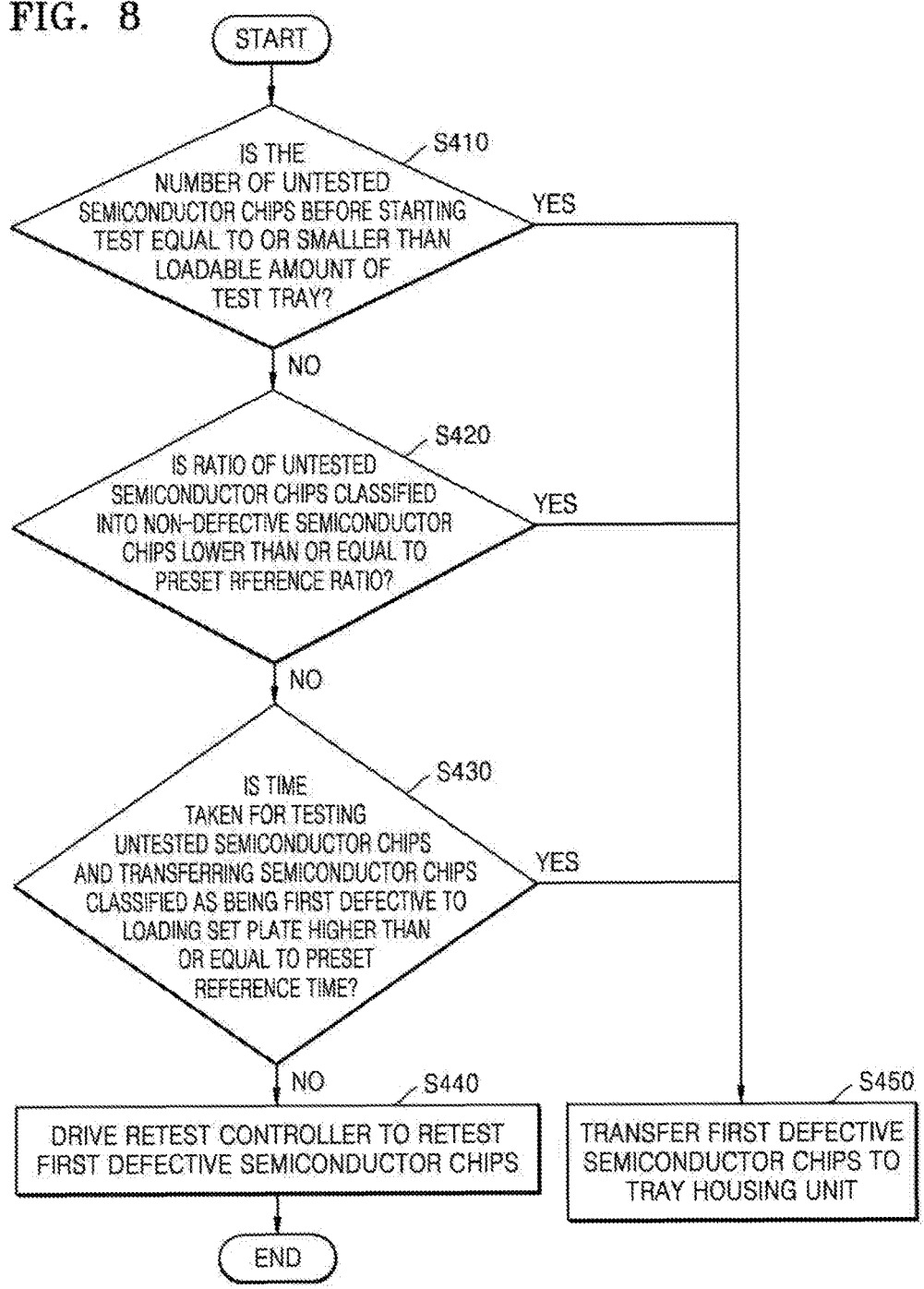
FIG. 8 is a flowchart of a semiconductor test method using a semiconductor test apparatus, according to certain exemplary embodiments.

FIG. 8 is a flowchart of a semiconductor test method using a semiconductor test apparatus, according to an exemplary embodiment.

Referring to FIGS. 1 and 8, the semiconductor test apparatus 100 may not retest first defective semiconductor chips in a preset case and may enable the first defective semiconductor chips to be housed in the second tray housing unit 110b housing secondary defective semiconductor chips.

For example, a determination is made as to whether the number of semiconductor chips to be tested before starting a test is equal to or smaller than a loadable amount of the test tray 125 in operation S410. If it is determined that the number of semiconductor chips to be tested is equal to or smaller than the loadable amount of the test tray 125 (S410, Yes), first defective semiconductor chips located on the unloading set plate 141 are transferred to the second tray housing unit 110b in operation S450. In the above-described case, the semiconductor chips to be tested may be all loaded onto the test tray 125, and all of the semiconductor chips may be tested through a one-time test. In such embodiments, first defective semiconductor chips may not be distinguished from secondary defective semiconductor chips, and the first defective semiconductor chips housed in the second tray housing unit 110b may be transferred to the loading set plate 121 to be retested. However, the disclosed concepts are not limited thereto, and the first defective semiconductor chips may not be housed in the tray housing unit 110 but may be immediately transferred from the unloading set plate 141 to the loading set plate 121 to be retested.

If it is determined that the number of semiconductor chips to be tested is not equal to or smaller than the loadable amount of the test tray 125 (S410, No), untested semiconductor chips are tested to determine whether a ratio of the untested semiconductor chips classified into non-defective semiconductor chips is lower than or equal to a reference ratio in operation S420. If it is determined that the ratio of the untested semiconductor chips is lower than or equal to the reference ratio (S420, Yes), first defective semiconductor chips classified in the unloading set plate 141 may be transferred to the second tray housing unit 110b to be housed along with secondary defective semiconductor chips in the second tray housing unit 110b in operation S450. For example, if a yield is lower than or equal to a preset ratio, semiconductor chips determined as being first defective may not be retested with untested semiconductor chips. However, it may be efficient to collect and test semiconductor chips classified as being defective all together. In certain embodiments, a preset reference ratio may be set by a user before performing a test and may be, for example, about 50%, but is not limited thereto.

If it is determined that the ratio of the untested semiconductor chips is lower than or equal to the reference ratio (S420, No), a determination is made as to whether a time taken for testing the untested semiconductor chips and transferring semiconductor chips classified as being first defective to the loading set plate 121 is higher than or equal to a preset reference time in operation S430. For example, a determination is made as to whether a time taken for one-time cycle test is higher than or equal to a preset reference time. If it is determined that the time taken for the one-time cycle test is higher than or equal to the preset reference time (S430, Yes), first defective semiconductor chips classified in the unloading set plate 141 may be transferred to the second tray housing unit 110b to be housed along with secondary defective semiconductor chips in the second tray housing unit 110b in operation S450. If the time taken for the one-time cycle test is higher than or equal to the preset reference time, it may be efficient to equally treat the first defective semiconductor chips and the secondary defective semiconductor chips without distinguishing the first defective semiconductor chips from the secondary defective semiconductor chips. The preset reference time may be set by the user before performing the test. For example, the preset reference time may be a threshold reference time that may be determined and set prior to the testing process. If it is determined in operation S410 that the number or semiconductor chips to be texted is larger than the loadable amount of the test tray 125 before starting the test (S410, No), and if it is determined in operation S420 that the ratio of the untested semiconductor chips classified into non-defective semiconductor chips is larger than the reference ratio (S420, No), and if it is determined in operation S430 that the time taken for testing the untested semiconductor chips and transferring semiconductor chips classified as being first defective to the loading set plate 121 is lower than the preset reference time (S430, No), the retest controller 150 may be driven to transfer the first defective semiconductor chips loaded onto the unloading set plate 141 to the loading set plate 121 to retest the first defective semiconductor chips in operation S440.

While the disclosure has been particularly shown and described with reference to embodiments thereof, it will be understood that various changes in form and details may be made therein without departing from the spirit and scope of the following claims.

Accordingly, while embodiments are capable of various modifications and alternative forms, embodiments thereof are shown by way of example in the drawings and will herein be described in detail. It may be understood, however, that there is no intent to limit embodiments to the particular forms disclosed, but on the contrary, embodiments are to cover all modifications, equivalents, and alternatives falling within the scope of the disclosed embodiments.

What is claimed is:

1. A semiconductor test apparatus comprising:
a tray housing unit configured to house a customer tray on which are loaded one or more of untested semiconductor chips, secondary defective semiconductor chips, and non-defective semiconductor chips;
a loader configured to locate the untested semiconductor chips supplied from the tray housing unit on a loading set plate, and load the untested semiconductor chips onto a test tray;
a tester configured to test the untested semiconductor chips loaded on the test tray, wherein the test tray is loadable into and removable from the tester;
an unloader configured to remove the test tray from the tester, unload the tested semiconductor chips loaded on the test tray, and classify the tested semiconductor chips as first defective semiconductor chips, the secondary defective semiconductor chips, and the non-defective semiconductor chips, wherein the unloader is further configured to transfer the first defective semiconductor chips to a first unloading set plate, the secondary defective semiconductor chips to a second unloading set plate, and the non-defective semiconductor chips to a third unloading set plate; and
a retest controller configured to transfer the secondary defective semiconductor chips and the non-defective semiconductor chips to the tray housing unit, and transfer the first defective semiconductor chips from the first unloading set plate to the loading set plate,
wherein the tester is further configured to retest the first defective semiconductor chips, wherein the loader is configured to load at least one of the first defective semiconductor chips and at least one of the untested semiconductor chips onto the test tray when the test tray is in the loader, and wherein the tester is configured to simultaneously test the at least one of the first defective semiconductor chips and the at least one of the untested semiconductor chips.

2. The semiconductor test apparatus of claim 1, wherein the retest controller transfers the first defective semiconductor chips from the first unloading set plate to the loading set plate when the retest controller senses the loading set plate is empty.

3. The semiconductor test apparatus of claim 2, wherein the retest controller begins operating if the first defective semiconductor chips are on the first unloading set plate and stops operating when all of the first defective semiconductor chips have been transferred from the loading set plate to the test tray.

4. The semiconductor test apparatus of claim 1, wherein the unloader is further configured to load the first defective semiconductor chips onto a customer tray to be transferred from the first unloading set plate to the loading set plate.

5. The semiconductor test apparatus of claim 1, wherein when numbers of the untested semiconductor chips and the first defective semiconductor chips are equal to or smaller than a loadable amount of the test tray, the loader is configured to load all of the untested semiconductor chips and all of the first defective semiconductor chips onto the test tray and then load the test tray into the tester.

6. The semiconductor test apparatus of claim 5, wherein if a number of the untested semiconductor chips of the number equal to or smaller than the loadable amount of the test tray and the first defective semiconductor chips that are tested and classified as being first defective semiconductor chips according to a test result, the retest controller stores those classified as being first defective semiconductor chips in the test tray in the tray housing unit.

7. The semiconductor test apparatus of claim 6, wherein the first defective semiconductor chips housed in the tray housing unit and the secondary defective semiconductor chips are transferred to the loader and retested by the tester.

8. The semiconductor test apparatus of claim 1, wherein if a ratio of the untested semiconductor chips classified as the non-defective semiconductor chips to a total number of untested semiconductor chips is less than or equal to a preset reference ratio, the retest controller stores the first defective semiconductor chips in the tray housing unit.

9. The semiconductor test apparatus of claim 1, wherein if a time period required by the semiconductor test apparatus for testing the untested semiconductor chips and transferring semiconductor chips classified as the first defective semiconductor chips to the loading set plate is greater than or equal to a preset reference time, the retest controller stores the first defective semiconductor chips in the tray housing unit.

10. The semiconductor test apparatus of claim 1, wherein the tester comprises a soak chamber configured to pre-heat tested semiconductor chips, a test chamber for testing semiconductor chips transferred from the soak chamber, and a desoak chamber configured to discharge semiconductor chips transferred from the test chamber and reduce temperatures of the semiconductor chips transferred from the soak chamber to room temperature.

11. The semiconductor test apparatus of claim 1, wherein the tray housing unit comprises a first tray housing unit configured to house the untested semiconductor chips, a second tray housing unit configured to house the secondary defective semiconductor chips, and a third tray housing unit configured to house the non-defective semiconductor chips.

12. The semiconductor test apparatus of claim 1, wherein the first unloading set plate comprises a customer tray for loading the first defective semiconductor chips, wherein the second unloading set plate comprises a customer tray for loading the secondary defective semiconductor chips, and wherein the third unloading set plate comprises a customer tray for loading the non-defective semiconductor chips.

13. The semiconductor test apparatus of claim 1, wherein the test tray sequentially circulates through the loader, the tester, and the unloader.

14. A semiconductor test apparatus comprising:
a tray housing unit configured to house a first tray housing unit configured to house untested semiconductor chips, a second tray housing unit configured to house secondary defective semiconductor chips, and a third tray housing unit configured to house non-defective semiconductor chips;
a loader configured to locate the untested semiconductor chips supplied from the first tray housing unit on a loading set plate and load the untested semiconductor chips onto a test tray;
a tester configured to test the untested semiconductor chips loaded on the test tray, wherein the test tray is loadable into and removable from the tester;
an unloader configured to unload semiconductor chips loaded on the test tray taken from the tester and classify tested semiconductor chips as first defective semiconductor chips, the secondary defective semiconductor chips, and the non-defective semiconductor chips to locate the first defective semiconductor chips to a first unloading set plate, the secondary defective semiconductor chips to a second unloading set plate, and the non-defective semiconductor chips on a third unloading set plate; and
a retest controller configured to respectively transfer the secondary defective semiconductor chips and the non-defective semiconductor chips to the second tray housing unit and the third tray housing unit and transfer the first defective semiconductor chips from the first unloading set plate to the loading set plate,
wherein the loader is further configured to load the first defective semiconductor chips onto the test tray, and
wherein the tester is further configured to retest the first defective semiconductor chips,
wherein the loader is configured to load at least one of the first defective semiconductor chips and at least one of the untested semiconductor chips onto the test tray when the test tray is in the loader, and
wherein the tester is configured to simultaneously test the at least one of the first defective semiconductor chips and the at least one of the untested semiconductor chips.

15. The semiconductor test apparatus of claim 14, wherein the retest controller transfers the first defective semiconductor chips from the first unloading set plate to the loading set plate when the retest controller senses the loading set plate is empty.

16. The semiconductor test apparatus of claim 15, wherein the retest controller begins operating if the first defective semiconductor chips are on the first unloading set plate and stops operating when all of the first defective semiconductor chips have been transferred from the loading set plate to the test tray.

17. The semiconductor test apparatus of claim 14, wherein the unloader is further configured to load the first defective semiconductor chips onto a customer tray to be transferred from the first unloading set plate to the loading set plate.

18. The semiconductor test apparatus of claim 14, wherein if a time period required by the semiconductor test apparatus for testing the untested semiconductor chips and transferring semiconductor chips classified as the first defective semiconductor chips to the loading set plate is greater than or equal to a preset reference time, the retest controller stores the first defective semiconductor chips in the second tray housing unit.

* * * * *